(12) United States Patent
    Williams

(10) Patent No.:     US 11,411,351 B2
(45) Date of Patent:      Aug. 9, 2022

(54) INTERPOSER HAVING SHIELDED CONTACTS AND TRACES

(71) Applicant: GITech, Inc., Austin, TX (US)

(72) Inventor: John Williams, Austin, TX (US)

(73) Assignee: GITech, Inc., Austin, TX (US)

( * ) Notice: Subject to any disclaimer, the term of this patent is extended or adjusted under 35 U.S.C. 154(b) by 45 days.

(21) Appl. No.: 17/134,449

(22) Filed: Dec. 27, 2020

(65) Prior Publication Data

US 2022/0209466 A1    Jun. 30, 2022

(51) Int. Cl.
| | |
|---|---|
| H01R 4/66 | (2006.01) |
| H01R 13/6471 | (2011.01) |
| H01R 13/24 | (2006.01) |
| H01R 13/05 | (2006.01) |
| H01R 13/6587 | (2011.01) |
| H01R 13/652 | (2006.01) |

(52) U.S. Cl.
CPC ....... *H01R 13/6471* (2013.01); *H01R 13/052* (2013.01); *H01R 13/2492* (2013.01); *H01R 13/652* (2013.01); *H01R 13/6587* (2013.01)

(58) Field of Classification Search
CPC ...... H01R 13/04; H01R 13/05; H01R 13/052; H01R 13/652; H01R 13/2492; H01R 13/6461; H01R 13/6471; H01R 13/6585; H01R 13/6587
USPC .................................................. 439/101, 108
See application file for complete search history.

(56) References Cited

U.S. PATENT DOCUMENTS

| | | | | |
|---|---|---|---|---|
| 5,224,918 A | * | 7/1993 | Neumann | H01R 13/6585 29/830 |
| 5,409,387 A | * | 4/1995 | Northey | H01R 13/6583 200/51.1 |
| 6,024,579 A | * | 2/2000 | Bennett | H01R 12/714 439/67 |
| 7,896,659 B1 | * | 3/2011 | Westman | H01R 13/6595 439/607.25 |
| 2002/0094705 A1 | * | 7/2002 | Driscoll | H01R 12/7064 439/65 |

* cited by examiner

*Primary Examiner* — Khiem M Nguyen

(57) ABSTRACT

A separable and reconnectable connector for semiconductor devices is provided that is scalable for devices having very small contact pitch. Connectors of the present disclosure include signal pins shielded by pins electrically-coupled to ground. Embodiments provide one or more signal pins in a contact array electrically-shielded by at least one ground pin coupled to a ground plane. Embodiments thereby provide signal pins, either single-ended or a differential pair, usable to transmit signals with reduced noise or cross-talk and thus improved signal integrity. Embodiments further provide inner ground planes coupled to connector ground pins to shield pairs of differential signal pins without increasing the size of the connector. Inner grounding layers can be formed within isolation substrates incorporated into connector embodiments between adjacent pairs of signal pins. These buried ground layers provide additional crosstalk isolation in close proximity to signal pins, resulting in improved signal integrity in a significantly reduced space.

20 Claims, 7 Drawing Sheets

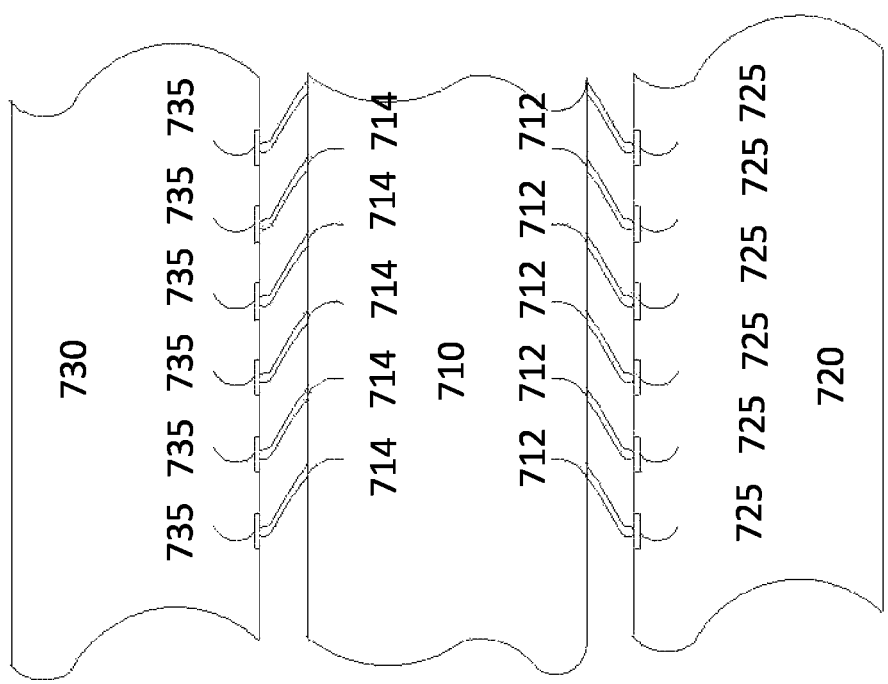

INTERPOSER HAVING SHIELDED CONTACTS AND TRACES

BACKGROUND

Field

This disclosure relates generally to reconnectable and remountable electrical connectors, and more specifically, to an electrical interposer having shielded contact probes and traces for coupling two or more electronic components.

Related Art

Electrical interposers or connectors are used to connect two or more electronic components together or to connect an electronic component to a piece of electrical equipment, such as a computer, router, or tester. In one example, an electrical interposer or connector can be used to connect an electronic component, such as an integrated circuit (IC) package or chip to a printed circuit broad (PCB). In another example, an electrical interposer can also be used during integrated circuit manufacturing for coupling an IC device under test to a test system. In some applications, the electrical interposer or connector provides separable or remountable connection so that the attached electronic component can be removed and reattached. For example, it may be desirable to mount a packaged microprocessor chip to a personal computer mother board using a separable interconnect device so that a malfunctioning chip can be readily removed or an upgraded chip can be readily installed.

Advances in semiconductor technologies have led to shrinking dimensions within integrated circuits and, particularly, decreasing pitch for the contact points on a silicon die or a semiconductor package. For example, contact pads on a semiconductor wafer can have a pitch of 250 microns or less. At a 500-micron package pitch level, conventional techniques to make separable electrical connections are prohibitively difficult and expensive. Issues become more critical as the pitch of contact pads on semiconductor packages decreases below 400 microns while simultaneous connection to multiple contact pads in an array is required.

High-speed communication applications further exacerbate issues associated with electrically coupling semiconductor devices. In high-speed applications, differential signal pairs normally cannot be placed in adjacent positions because noise easily transfers from one differential pair to a neighboring differential pair. Conventional PCIe connectors, for example, incorporate grounded contact elements positioned between every adjacent pair of differential signal pins to reduce crosstalk noise. This conventional method increases pin count and connector size and requires additional PCB area to incorporate the connection.

PCB traces, connectors, cables, and even IC packages are system-level bandwidth limiters that make designs at high data rates, such as PCIe, challenging. The high signal frequencies increase copper and power loss, which causes transmission distances to decrease. In addition, the channel loss in higher signal frequencies causes signal integrity issues. To meet the requirements of a wide range of applications, there are many types of PCIe channels, from chip-to-chip topology without connectors to complex server topology with backplane interfaces that include multiple PCB cards and two or more connectors.

BRIEF DESCRIPTION OF THE DRAWINGS

Embodiments of the present invention may be better understood by referencing the accompanying drawings.

FIG. 7 is a simplified block diagram illustrating an example of an interposer coupling two semiconductor devices in accordance with embodiments of the present invention.

The use of the same reference symbols in different drawings indicates identical items unless otherwise noted. The figures are not necessarily drawn to scale.

DETAILED DESCRIPTION

Figure 1:
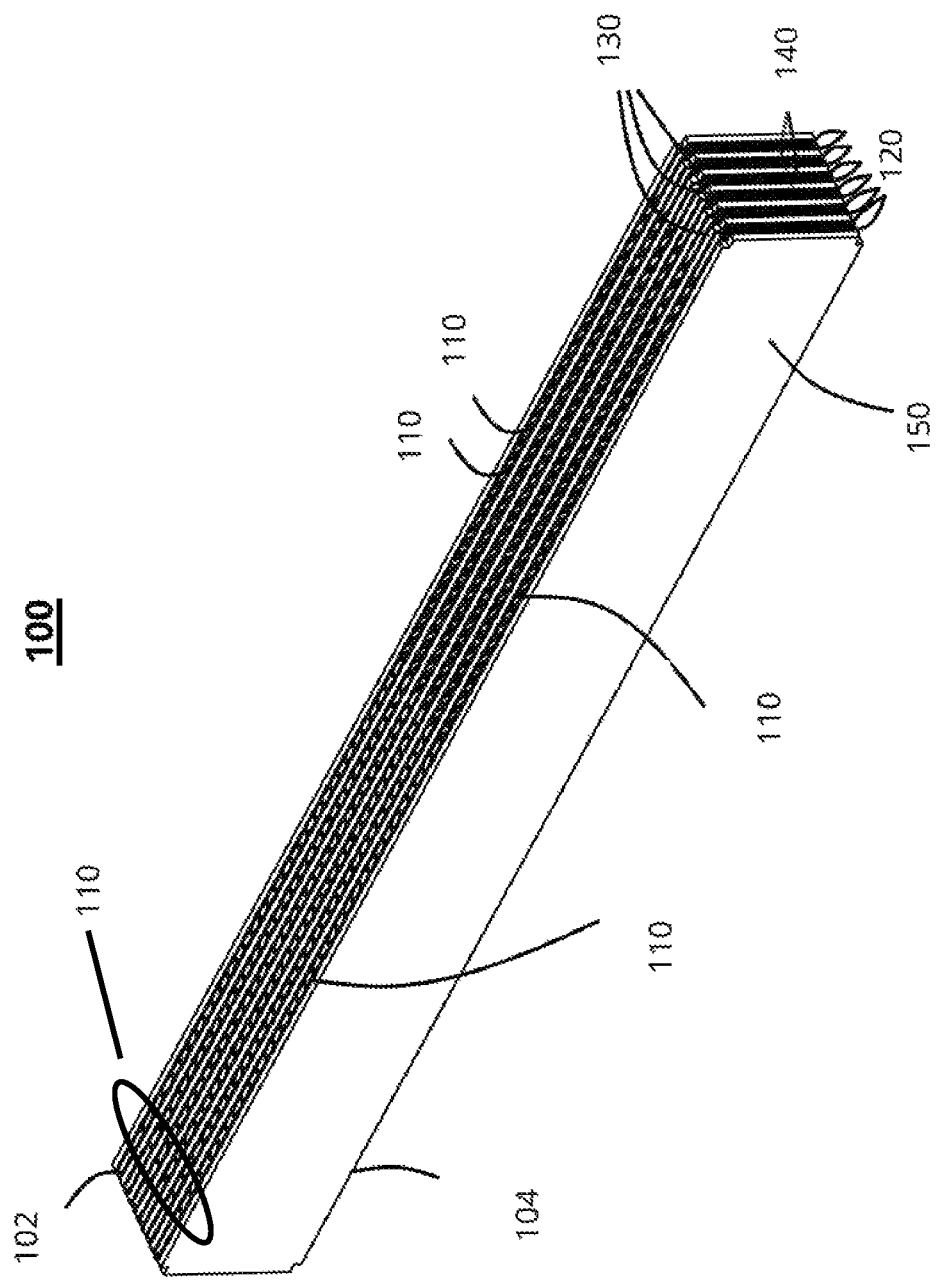
FIG. 1 is a simplified perspective view illustration of an interposer configured in accordance with an embodiment of the present invention.

Embodiments of the present invention provide a separable and reconnectable connector for semiconductor devices that is scalable for devices having very small contact pitch. The connectors of the present invention include signal pins shielded by pins electrically-coupled to ground. Embodiments provide one or more signal pins in a contact array electrically-shielded by at least one ground pin coupled to a ground plane. Embodiments thereby provide signal pins, either single-ended or a differential pair, usable to transmit signals with reduced noise or cross-talk and thus improved signal integrity. Embodiments further provide inner ground planes coupled to connector ground pins to shield pairs of differential signal pins without increasing the size of the connector. Inner grounding layers can be formed within isolation substrates incorporated into connector embodiments between adjacent pairs of signal pins. These buried ground layers provide additional crosstalk isolation in close proximity to signal pins, resulting in improved signal integrity in a significantly reduced space.

Electrical interposers or connectors are used to couple two or more electronic components together or to connect an electronic component to other electrical equipment. Depending on the nature of the application, it can be desirable to provide either a permanent or a separable coupling between the electronic components. The ability to make separable electrical connections with contacts of semiconductor scale electronic circuits has become increasingly challenging as mechanical, electrical, and reliability requirements of the electrical connections become more demanding. Nano springs, pogo pins, micro springs, and other miniature contact devices have been developed to make reliable electrical contact between semiconductor integrated circuits (ICs) or between an integrated circuit and an electronic system, such as one built on a printed circuit board (PCB). In some applications, conventional electrical connectors are made of stamped metal springs, which are formed and then individually inserted into an insulating carrier to form an array of electrical connector elements. Other approaches to providing electrical connectors have included anisotropically conductive adhesives, injection molded conductive adhesives, bundled wire conductive elements, springs formed by wire bonding techniques, and small solid pieces of metal.

Land grid arrays and ball grid arrays are different types of connector arrays commonly used for semiconductor device applications. A land grid array (LGA) refers to an array of metal pads, called lands, that are the electrical contact points on an IC package, a printed circuit board, or other electronic component. The metal pads are usually lithographically defined and etched on an isolating surface or substrate. It is common to then coat the exposed surface of the pads with a gold film or other noble metal to provide a non-oxidizing surface. A ball grid array (BGA) refers to an array of solder balls or solder bumps that are the electrical contact points for an IC package. Each of LGA and BGA packages has associated advantages or disadvantages. For instance, LGA packages are typically cheaper to manufacture than BGA packages because there is no need to form solder balls or solder bumps. But LGA packages are typically more difficult to couple onto a PC board or a multi-chip module. An LGA connector is usually needed to provide removable and remountable socketing capability for LGA packages.

Additionally, advances in semiconductor technologies have led to shrinking dimensions within ICs and, as a consequence, decreasing pitch for contact points on silicon die and semiconductor packages. Below 500µ pitch spacing, it can be prohibitively difficult and costly to use conventional techniques to provide separable connections. Embodiments of the present invention seek to address these issues.

Embodiments of the present invention provide an interposer, or connector, that can be used to make electrical connections from components such as a printed circuit board (PCB) to another PCB, to a system on a chip (SoC), such as a central processing unit, microprocessor, network processor unit, neural processing unit, or graphic processing unit, or other semiconductor device or package. The interposer or connector can be used to make electrical connections to electrical contact points formed on any electronic component. As discussed above, such electrical contact points can be an array of metal pads, such as an LGA or BGA or other types of contact points.

FIG. 1 is a perspective view illustration of an interposer 100 configured in accordance with an example embodiment of the present invention. Interposer 100 is configured to provide electrical conductivity from surface 102 to surface 104 using a conductor that extends from surface 102 as pins 110, through the body of interposer 100, and extending from surface 104 as corresponding pins (not shown). Throughout this disclosure, the terms "interposer" and "connector" are terms that refer to structure 100 and others providing similar functionality and may be used interchangeably. As will be discussed in greater detail below, interposer 100 includes a conductive contact array formed from a conductive layer 120 that is formed on a first major surface of an isolation substrate 130 and corresponding conductive contact array formed on another conductive layer 120 formed on a second major surface of the isolation substrate.

Figure 2:
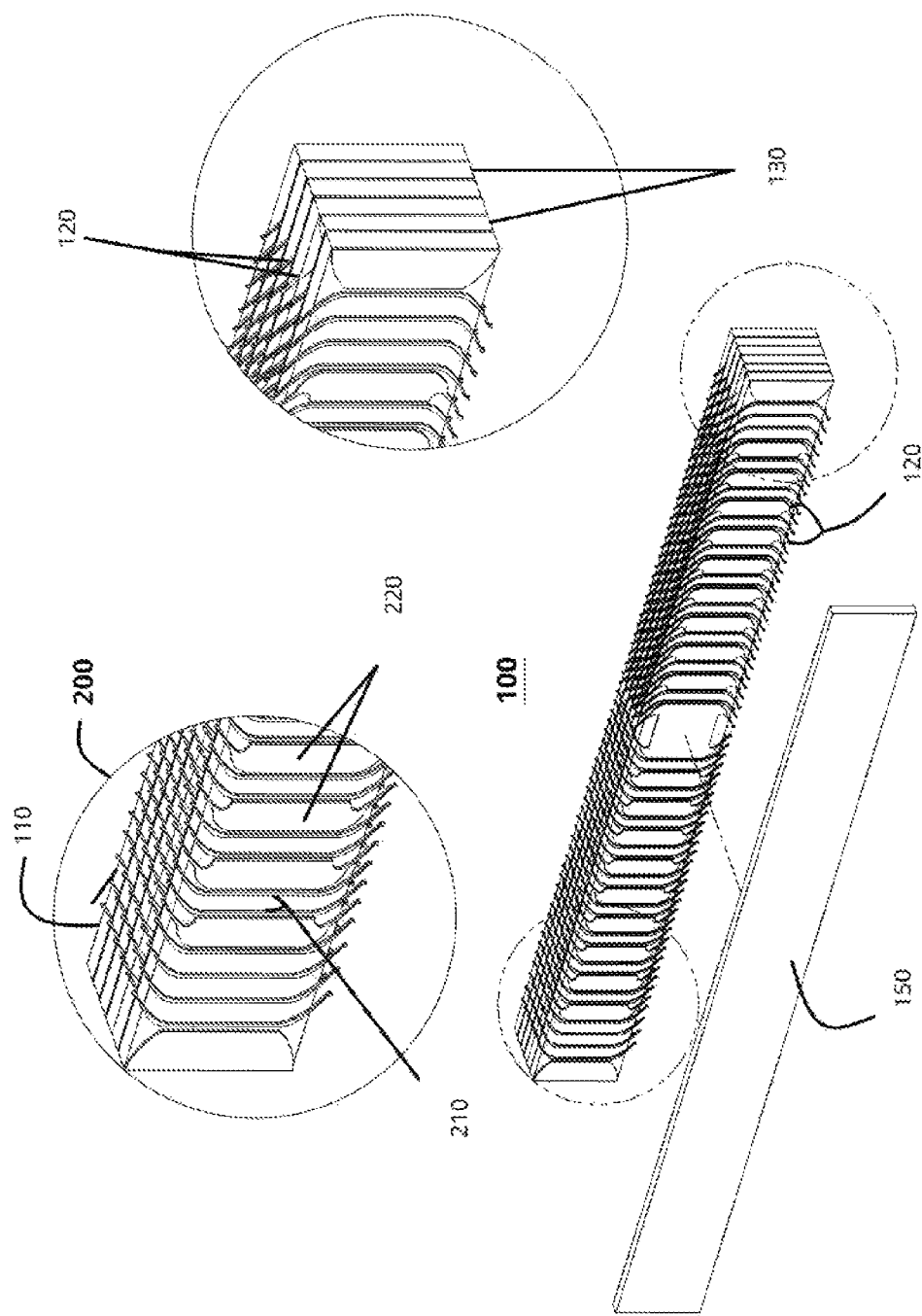
FIG. 2 is a simplified, exploded, perspective view illustration of an interposer configured in accordance with an embodiment of the present invention.

FIG. 2 is an exploded, perspective view illustration of interposer 100. An outer isolation layer 150 is removed from interposer 100 to reveal conductive array 200 formed from conductive layer 120. In this example embodiment, conductive array 200 is formed to provide differential pair conductors 210 separated by at least one ground pin 220. Each conductive layer 120 can be considered a signal layer separated by an inner isolation layer 130. Between each isolation layer 130 with conductive layers 120 formed thereon can be placed an additional isolation layer 140 for electrical separation. In one embodiment, conductive array 200 is formed as a two-dimensional array of conductive contact elements. This two-dimensional conductive array is illustrative only and embodiments are not limited to a two-dimensional array. Conductive array elements can be arranged in any configuration or design indicated for an application coupling components.

As will be discussed in greater detail below, for additional electrical isolation, shaped openings (e.g., vias) can be formed from the ground pins in the conductive array through the isolation substrate to a ground plane located either on or beneath the isolation substrate. Once electrically coupled to the ground plane, the ground pins can help reduce noise or cross-talk around high-speed signal lines.

As illustrated in FIGS. 1 and 2, the contact elements on conductive layer 120 (e.g., pins 110) are formed as conductive, compliant spring contact elements. In other embodiments, the contact elements can be formed as part of or to contact with a land grid array or a ball grid array. Other types of contact elements can be used depending upon the nature of the components which the interposer is intended to connect. In addition, the contact elements formed from the conductive layers need not be homogeneous. For example, the contact elements formed using a first conductive layer 120 can be of a first type (e.g., compliant spring elements) while the contact elements formed using a second conductive layer 120 can be of a second type (e.g., ball grid array contacts). The contact elements used for the contact array formed by the interposer can be selected in light of the type of contact structures on the components to which the interposer is to be coupled. In some embodiments, the contact elements can be single-ended, depending on the nature of the application. Conductive layer 120 can be formed from any type of conductive material that can provide a spring force. In some embodiments, conductive layer 120 is formed from copper or a copper alloy, such as, for example, beryllium copper. In other embodiments, conductive layer 120 can be formed from spring steel or another conductive metal or metal alloy.

In some embodiments, the isolation layers of the interposer (e.g., outer isolation layer 150 and inner isolation layers 130) are formed from printed circuit board (PCB) material. The material used in a PCB is chosen for the environment and application of the device design because the materials can affect thermal behavior as well as electrical and mechanical characteristics of the interposer. The range of materials for PCBs has grown over time, with circuit materials optimized for specific frequency ranges (e.g., millimeter-wave). Most PCB materials usable for embodiments can be classified as either a "hard" or rigid circuit material or a "soft" or flexible circuit material. Hard PCB materials are typically based on some form of a ceramic base, such as alumina, aluminum nitride, and beryllium oxide. Hard PCB materials can also serve as substrates for integrated circuits such as gallium arsenide, gallium nitride, silicon, and silicon carbide. Soft PCB materials are generally formed from a rubber-like material and are primarily used for RF applications. Such soft PCB materials can have an elastic modulus lower than 100 MPa, as compared to epoxy materials (5-20 GPa) and ceramics (>100 GPa).

Certain PCB materials are better suited for microwave and other high-frequency applications. For example, the popular glass-reinforced epoxy material called FR-4 is not well suited to certain applications due to a high dielectric loss at microwave frequencies. Such high losses can make FR-4 ill-suited for high-speed digital circuits or high-frequency analog applications above a few gigahertz. On the other hand, there are certain materials engineered for low dissipation factor at higher frequencies, such as flexible materials based on PTFE. In addition, less-flexible ceramic circuit materials, such as alumina, are used in millimeter-wave-frequency packaging and other infrastructure packaging due to being better suited for use with circuit transmission lines at microwave and millimeter-wave frequencies.

Figure 3:
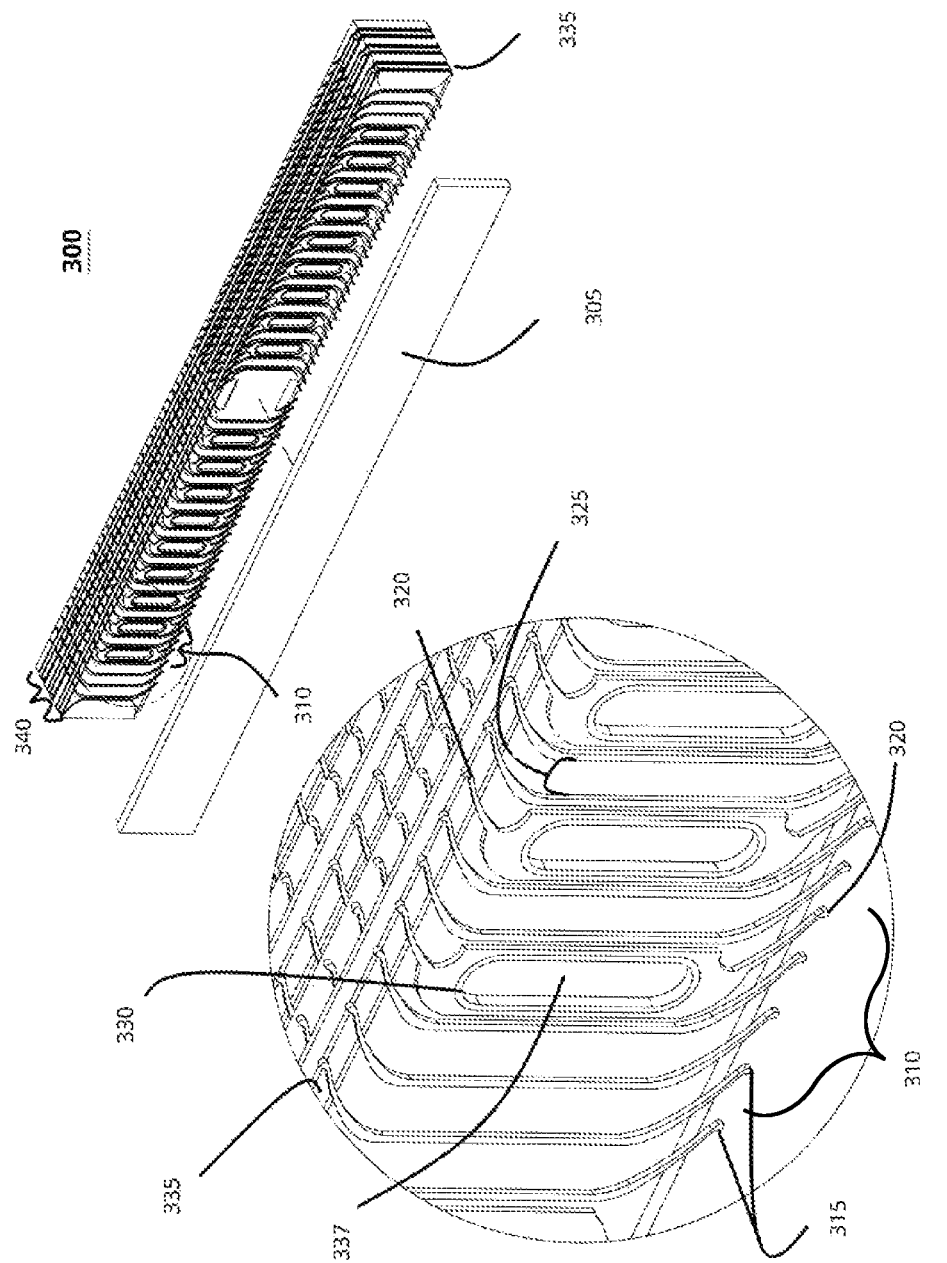
FIG. 3 is a simplified, exploded, perspective view illustration of an interposer configured in accordance with another example embodiment of the present invention.

FIG. 3 is an exploded, perspective view of an interposer 300 configured in accordance with an alternative example embodiment of the present invention. Outer isolation layer 305 is removed from interposer 300 to reveal a set of conductive arrays stacked to form the interposer. In this embodiment a contact array 310 is formed with signal conductors 315 and periodically placed ground probes or pins 320 between signal conductors forming a shielded differential pair (e.g., differential pair conductors 325). In the illustrated embodiment, a conductive conduit 330 is formed through a hole 337 in isolation layer 335 on which the contact array is formed. Conductive conduit 330 provides an electrical connection between corresponding conductive contact elements formed on the major surfaces of isolation layer 335 to one or more conductive planes formed either in or on isolation layer 335. By doing so, electrical shielding can be provided for high-speed signal pins while enabling a compact dimension for the interposer.

Conductive conduit 330 can be provided, for example, by providing a planar sheet of contact probes with specific geometric openings formed into a thin conductive plane or sheet of elastic material. Subsequent processing can allow the sheet of contact probes and openings to be registered and attached to an isolating substrate (e.g., 335) containing matching openings as those found on the conductive array of contact probes. Subsequent metallization couples the conductive spring sheet of probes to at least one ground plane. Spring elements can then be isolated into discrete contact probes or contact elements. This defines the basic building block of an interposer array block (e.g., 340) and will be subsequently referred to as an interposer unit. When combined with other interposer units, they form the basis of an interposer block of probe arrays.

Embodiments can provide contacts through the interposer for a variety of functions. In one embodiment, a subset of the contacts are signal (e.g., pins 315) or differential signal pins (e.g., pins 325) that include contact elements formed on the upper and lower isolation surfaces. Both signal and differential signal pins will be referred to as "signal pins," unless being specifically differentiated. In some embodiments, an interposer can be constructed having pairs of signal pins isolated by ground pins and inner ground planes, where the pairs of signal pins can be used to transmit a differential signal pair. In alternative embodiments, the interposer can be constructed for transmitting single-ended signals or open-ended signals. In such cases, a single signal pin is isolated by ground pins and internal ground planes connected to surface ground pins. Interposers can be formed to incorporate various pin and signal configurations as appropriate for a particular application.

Differential signal pins and other signal pins can be isolated from ground planes by the isolation layers (e.g., 335). In some embodiments, the interposer can include conductive openings 330 (e.g., "ground openings") configured to provide ground signal to ground plane connection. In some embodiments, each pair of signal pins forming a differential signal pair is provided with ground shielding, via ground pins or ground planes, to reduce crosstalk and improve signal integrity.

As illustrated, compliant spring contact elements are used for the top and bottom surface of the interposer block. As discussed above, embodiments of the present interposer are not limited to a particular type of contact element, and different types of contact elements can be used on the two surfaces of the interposer. It should also be noted that FIG. 3 is not intended to illustrate the actual order of elements or the actual construction of the interposer.

Figure 4:
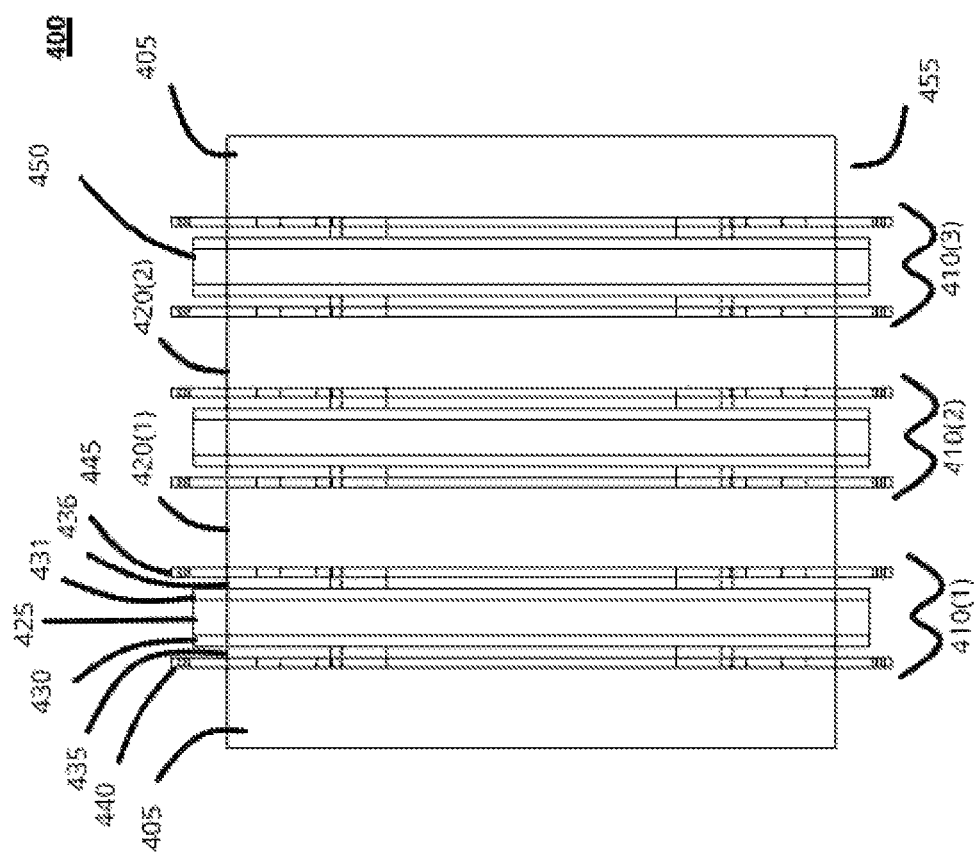
FIG. 4 is a simplified block diagram illustrating an end view of a contact array of an interposer constructed in accordance with embodiments of the present invention.

FIG. 4 is a simplified block diagram illustrating an end view of a contact array of an interposer 400 constructed in accordance with embodiments of the present invention. Interposer 400 includes outer isolation layers 405 protecting a set of interposer units 410(1)-(3). Interposer units 410(1)-(3) are separated by inner isolation layers 420(1)-(2). It should be understood that embodiments of the present invention are not limited to the illustrated number of interposer units or inner isolation layers, except that an inner isolation layer is used to separate two interposer units. Each interposer unit 410 is formed around an inner isolation layer 425 that has formed on opposing major surfaces conductive layers forming internal ground planes 430 and 431. On at least a portion of each major surface of internal ground planes 430 and 431 is formed an isolation layer 435 and 436, respectively. On the isolation layers 435 and 436 is formed conductive layers 440 and 441, respectively, which are formed into contact elements that provide signal pins or ground probes (e.g., 315, 320, and 325). When the interposer units are combined, they form the basis of an interposer array block to transport shielded signals between surfaces 450 and 455.

Figure 5:
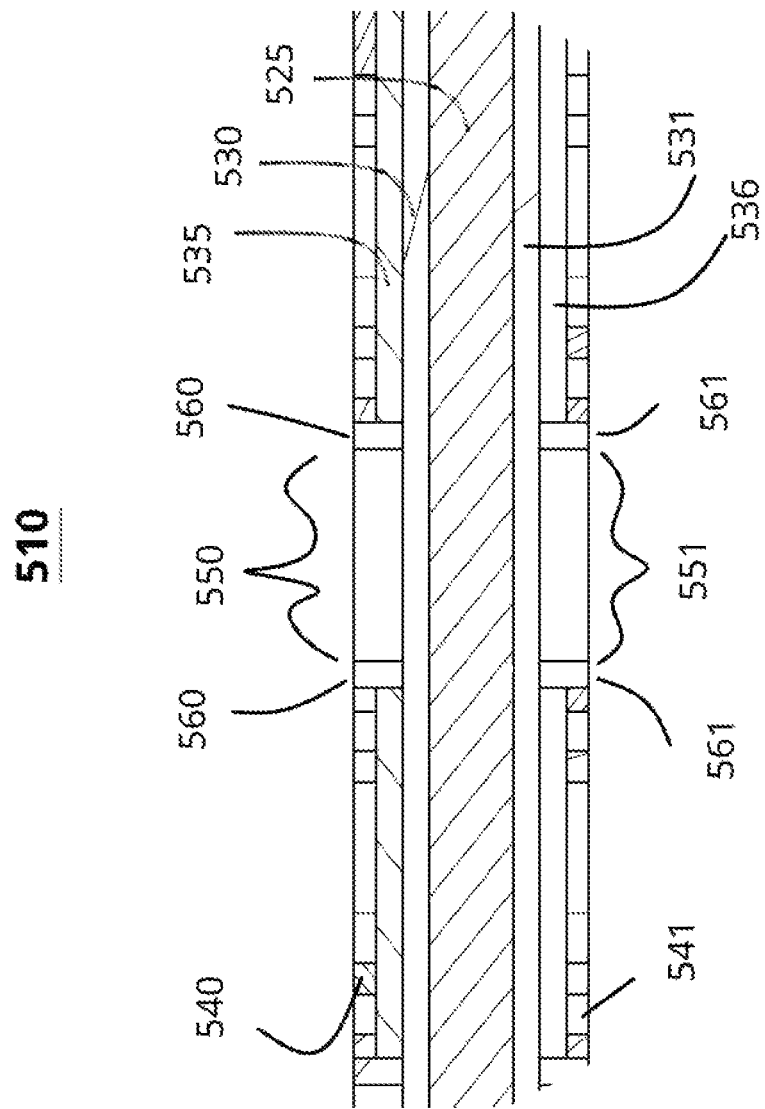
FIG. 5 is a simplified block diagram illustrating a cross-section through an example interposer unit configured in accordance with an embodiment of the present invention.

FIG. 5 is a simplified block diagram illustrating a cross-section through an example interposer unit 510 in accordance with an embodiment of the present invention. Interposer unit 510 corresponds to a unit of interposer 300 illustrated in FIG. 3. FIG. 5 provides an example illustration of an electrical coupling from a contact array layer to a ground plane layer of the interposer unit. As illustrated in FIG. 4, interposer unit 510 is formed around an internal isolation layer 525. On each major surface of internal isolation layer 525 is formed a conductive layer 530 and 531, respectively. In one embodiment, conductive layers 530 and 531 provide ground planes to enhance electrical isolation characteristics of interposer unit 510. On the major surfaces of conductive layers 530 and 531 are formed another internal isolation layer 535 and 536, respectively. Contact array layers 540 and 541 are formed on isolation layers 535 and 536, respectively.

As illustrated in FIG. 3, ground pins 320 are included in the contact array to aid in electrically isolating differential pair pins 325. Ground pins 320 can be electrically coupled to the ground planes formed in the interposer unit by providing an opening 550 through isolation layer 535 that corresponds to an opening 337 formed in ground pin 330, in contact array layer 540. Conductive plating 560 is formed on the walls of openings 337 and 550 to electrically couple the ground pin to the ground plane. As illustrated, a corresponding hole 551 and plating 561 is provided through contact array layer 541 and internal isolation layer 536 to couple a ground pin to ground plane 531. Multiple openings or vias can be provided for electrical coupling ground pins to a ground plane formed in the interposer unit. Alternative embodiments can also provide coupling to circuitry for formed within an interposer unit from signal pins using vias through isolation layers.

Through the use of internal ground planes, the interposer can provide shielding to signal pins formed in the contact array layer. Differential pairs then can be placed directly adjacent to one another while still being electrically isolated through the ground shielding located within the interposer units. This permits the overall dimension of the interposer to be made more compact without sacrificing signal integrity. The contact array of pins is arranged such that each pair of differential pairs of signal pins is shielded from adjacent pairs of signal pints by at least one ground pin or at least one internal ground plane, or a combination thereof. In this manner, each differential pair of signal pins is shielded from adjacent differential pairs.

As illustrated in FIG. 5, the conductive openings or vias are formed in both the conductive contact array layer (e.g., 540) and the corresponding inner isolation layer (e.g., 535). The conductive conduit between a ground pin and the underlying conductive plane is formed as a conductive layer lining the sidewall of the opening formed in the isolation layer. The opening can remain hollow except for the conductive sidewall. In one example, the sidewall conductive layer can be a conductive layer formed by electroplating a conductive material such as, for example, copper, aluminum, tin, or any other conductive material. In other embodiments, a conductive link can be formed through the isolation layer using other conductive alternatives such as solder, metal plugs placed into openings in the isolation layer and coupled to one or more ground planes, or any other conductive element formed in the isolation layer and connected to the ground plane. In certain embodiment, the conductive element through the isolation layer can be any type of conductive interconnect formed through the isolation layer (e.g., a conductive via).

As illustrated in FIG. 5, an interposer unit can include an upper ground plane and a lower ground plane formed on the top and bottom opposing surfaces of the inner isolation substrate. In alternative embodiment, the interposer unit can incorporate other plane layer configurations, including, for example, ground planes, power planes, and thermal planes. Interconnect openings can be provided for coupling to any type of plane configuration, such as ground or power, from any other layer of the interposer unit. In certain embodiments, an interposer unit can incorporate a ground plane formed within an isolation unit instead of on a surface of an isolation substrate. In addition, an interposer can incorporate one or more conductive planes (e.g., ground planes) formed on a surface of an isolation substrate and within the isolation substrate. The buried conductive planes, functioning as ground planes, can provide crosstalk isolation in close proximity to the signal probes, which results in an improved signal integrity in a compact space. Embodiments of the present invention provide a connector formed in an area array configuration that enables a large number of differential signal pair connections, which can be valuable for applications such as PCIe.

Figure 6:
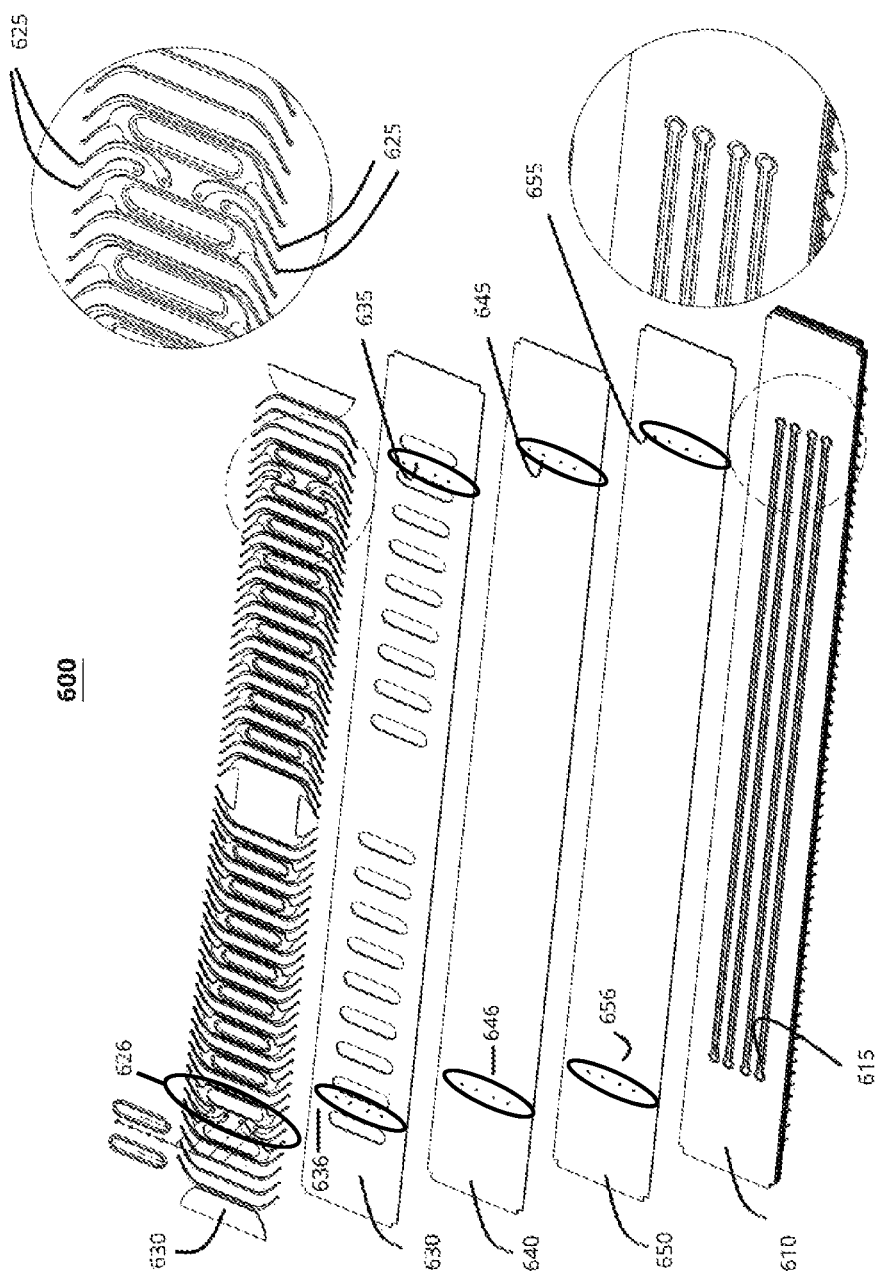
FIG. 6 is a simplified, exploded, perspective view illustration of an interposer unit configured in accordance with another example embodiment of the present invention.

FIG. 6 is a simplified, exploded, perspective view illustration of an interposer unit 600 configured in accordance with another example embodiment of the present invention. Interposer 600 incorporates an inner signal layer 610 that has formed a set of circuitized conductive signal traces 615 thereon. The conductive signal traces can provide a high-speed signal transmission highway between, for example, signal pins on opposite ends of the interposer unit. As with FIG. 3, interposer 600 provides a conductive array layer 620 formed as conductive pins. As illustrated, pairs of signal pins are separated by a grounding pin structure. In addition, on either end of conductive array 620 are a set of pins 625 and 626. These pins are intended to communicate directly with one another through the conductive signal traces 615. In order to provide this communication, pins 625 and 626 are communicatively coupled with conductive signal traces 615, through the intervening layers. As discussed above, conductive array layer 620 is formed on a first isolation layer 630. This isolation layer provides not only openings for ground pins from the conductive array layer to be coupled to a lower conductive layer 640 (e.g., a grounding layer), but also two sets of openings 635 and 636 corresponding to pins 625 and 626, respectively, through which a plated via can be formed for electrical coupling to the conductive traces on layer 610.

Further, conductive layer 640 also has sets of holes 645 and 646 formed therein to allow for a communicative coupling though the conductive layer. In order to isolate the conductive path from conductive layer 640, an isolating ring is formed around the edges of these holes. Conductive layer 640 is formed in contact with an inner isolation layer 650 that also incorporates holes 655 and 656 to permit the electrical coupling from pins 625 and 626 to inner signal layer 610 and traces 615 thereon.

As illustrated in FIG. 6, the conductive signal traces are formed on an inner signal layer 610. The traces can be isolated from but surrounded by a ground layer provided in conductive layer 640 and a ground layer formed on other layers not illustrated "below" the inner signal layer. In this manner, conductive signal traces 615 are shielded by the isolation layers and the adjacent ground planes. The conductive signal traces are also shielded from other signal traces on the middle ground plane by being isolated from and surrounded by the conductive ground layer inner interposer unit. In some embodiments, the conductive signal traces can be formed as differential signal traces.

Conductive signal traces 615 can be formed on inner signal layer 610 from any conductive material, such as but not limited to doped amorphous silicon, doped polysilicon, aluminum, copper, tantalum, titanium, tungsten, or any metal alloy, nitride or silicide thereof or any material to be made conductive by subsequent implantations of dopants, such as undoped polysilicon, for example. In some embodiments, alloys of tungsten, such as a tungsten metal or tungsten silicide, may be advantageous due to the good thermal stability properties of tungsten. In other embodiments, it may be advantageous for the conductive signal traces to include amorphous silicon or polysilicon (either doped or doped by subsequent implantations of dopants).

FIG. 7 is a simplified block diagram illustrating an example of an interposer coupling two semiconductor devices in accordance with embodiments of the present invention. An interposer 710 is configured to couple a contact pads of a first semiconductor device 720 with contact pads of a second semiconductor device 730. A set of spring compliant contact pins 712 extend from interposer 710 into contact with a corresponding set of contact pads 725 of semiconductor device 720. Similarly, a set of spring compliant contact pins 714 extend from interposer 710 into contact with a corresponding set of contact pads 735 of semiconductor device 730. As illustrated above, the sets of contact pins from the interposer provide an electrical coupling between the contact pads of semiconductor devices 720 and 730. The spring compliant contact pins are held in place against the contact pads from pressure applied by a mechanical coupling holding the two semiconductor devices together (e.g., a screwed down heat shield or other type of frame). As discussed above, embodiments are not limited to the types of semiconductor devices 720 and 730, which can be a semiconductor package, PCB board, semiconductor device die, and the like.

Embodiments of the present invention provide a compact, versatile mechanism for electrically coupling semiconductor devices together to exchange signals and power. Using a multi-layered approach, interposers configured in accord with the present disclosure can provide a high density, shielded set of signal conductors that can be configured in a variety of ways while providing a physically robust coupling.

By now it should be appreciated that there has been provided and interposer connector for electrically coupling conductive structures formed on a first electronic component to conductive structures formed on a second electronic component. The interposer includes a first isolation layer including one or more holes extending from a first major surface of the first isolation layer to a second major surface of the first isolation layer, a first conductive layer provided adjacent to and having a first major surface in contact with the first major surface of the first isolation layer, a first set of ground contact elements provided on the second major surface of the first isolation layer where the first set of ground contacts are in electrical contact with the first conductive layer using a conductor provided in a hole of the one or more holes through the first isolation layer, and a first set of contact elements provided on the second major surface of the first isolation layer where a signal contact element of the first set of signal contact elements is placed near to but electrically isolated from a ground contact element of the first set of ground contact elements.

In one aspect of the above embodiment, the first conductive layer is configured as a ground plane. In a further aspect, the signal contact element is electrically isolated from the ground plane.

In another aspect of the above embodiment, the conductor formed in the hole includes a conductive plating formed on side walls of the hole. In yet another aspect of the above embodiment, the conductor formed in the hole includes a conductive via formed within the hole.

In still another aspect of the above embodiment, the interposer further includes a plurality of interposer units are each interposer unit includes the first isolation layer, the first conductive layer, the first set of ground contact elements, and the first set of signal contact elements. In a further aspect, each interposer unit further includes: a second isolation layer provided adjacent to and having a first major surface in contact with a second major surface of the first conductive layer where the second major surface of the first conductive layer is opposite to the first major surface of the first conductive layer; a second conductive layer provided adjacent to and having a first major surface in contact with a second major surface of the second isolation layer where the second major surface of the second isolation layer is opposite to the first major surface of the second conductive layer; a third isolation layer including one or more holes extending from a first major surface of the third isolation layer to a second major surface of the third isolation layer where the third isolation layer is provided adjacent to and having the first major surface in contact with a second major surface of the second conductive layer; a second set of ground contact elements provided on a second major surface of the third isolation layer, where the second set of ground contacts are in electrical contact with the second conductive layer using a conductor provided in a hole of the one or more holes through the third isolation layer, and the second major surface of the third isolation layer is opposite to the first major surface of the third isolation layer; and a second set of signal contact elements provided on the second major surface of the third isolation layer where a signal contact element of the second set of signal contact elements is placed near to but electrically isolated from a ground contact element of the second set of ground contact elements. In yet a further aspect, the interposer further includes an interior isolation layer including first and second opposing major surfaces. The first interposer unit of the plurality of interposer units is positioned adjacent to and having the first set of contact elements and first set of ground elements in contact with the first major surface of the interior isolation layer. A second interposer unit of the plurality of interposer units is positioned adjacent to and having the second set of contact elements and second set of ground elements in contact with the second major surface of the interior isolation layer.

In another aspect, the interposer unit further includes: a second isolation layer provided adjacent to and having a first major surface in contact with the second major surface of the first conductive layer where the second major surface of the first conductive layer is opposite to the first major surface of the first conductive layer; and ⅓ isolation layer provided adjacent to and having a first major surface in contact with a second major surface of the second isolation layer. Second major surface of the second isolation layer is opposite to the first major surface of the second isolation layer. The third isolation layer further includes a conductive signal traces formed on the first major surface of the third isolation layer. The conductive signal traces electrically coupled to one or more signal contact elements of the first set of signal contact elements and configured to provide a signal from one of the two or more signal contact elements to the other coupled signal contact elements. In a further aspect, the interposer further includes a conductive via, corresponding to each of the two or more signal contact elements, formed through the first isolation layer, first conductive layer, and second isolation layer and configured to electrically couple each of the two or more signal contact elements with the conductive trace. The conductive via formed through the first conductive layer is insulated from the first conductive layer.

In another aspect, a signal contact element of the first set of signal contact elements is configured to physically contact a conductive structure of the first electronic component, physically contact a conductive structure of the second electronic component, and electrically couple the conductive structure the first electronic component to the conductive structure of the second electronic component. In yet another aspect, the first isolation layer includes a printed circuit board substrate. In still another aspect, a first set of one or more signal pads of a first semiconductor device are placed in contact with corresponding signal contact elements of the first set of signal contact elements, a first set of one or more signal pads of a second semiconductor device are placed in contact with corresponding signal contact elements of the first of signal contact elements, and the interposer is configured to provide a signal path from a signal pad of the first semiconductor device to a signal pad of the second semiconductor device.

Another embodiment provides an electronic device that includes a first electronic component including a first plurality of conductive structures on a first major surface of the first electronic component, a second electronic component including a second plurality of conductive structures on a first major surface of the second electronic component, and an interposer electrically coupling one or more of the first plurality of conductive structures to corresponding conductive structures of the second plurality of conductive structures. The interposer includes a first isolation layer including one or more holes extending from a first major surface of the first isolation layer to a second major surface of the first isolation layer, a first conductive layer provided adjacent to and having a first major surface in contact with the first major surface of the first isolation layer, a first set of ground contact elements provided on the second major surface of the first isolation layer where the first set of ground contact elements are in electrical contact with the first conductive layer using a conductor provided in a hole of the one or more holes through the first isolation layer, a first set of signal contact elements provided on the second major surface of the first isolation layer where a signal contact element of the first set of signal contact elements is placed near to but electrically isolated from a ground contact element of the first set of ground contact elements, and the first set of ground contact elements and the first set of signal contact elements are configured to electrically couple a set of the first plurality of conductive structures to a set of the corresponding conductive structures of the second plurality of conductive structures.

In one aspect of the above embodiment, the interposer further includes a plurality of interposer units. Each interposer unit includes the first isolation layer, the conductive layer, the first set of ground contact elements, and the first set of signal contact elements. In a further aspect, each interposer unit further includes: a second isolation layer provided adjacent to and providing a first major surface in contact with second major surface of the first conductive layer where the second major surface of the first conductive layer is opposite to the first major surface of the first conductive layer; a second conductive layer provided adjacent to and having a first major surface in contact with a second major surface of the second isolation layer where the second major surface of the second isolation layer is opposite to the first major surface of the second conductive layer; a third isolation layer including one or more holes extending from a first major surface of the third isolation layer to a second major surface of the third isolation layer where the third isolation layer is provided adjacent to and having the first major surface in contact with a second major surface of the second conductive layer; a second set of ground contact elements provided on a second major surface of the third isolation layer; and a second set of signal contact elements provided on the second major surface of the third isolation layer. The second set of ground contact elements are in electrical contact with the second conductive layer using a conductor provided in a hole of the one or more holes through the third isolation layer. The second major surface of the third isolation layer is opposite to the first major surface of the third isolation layer. A signal contact element of the second set of signal contact elements is placed near to but electrically isolated from a ground contact element of the second set of ground contact elements. The second set of ground contact elements and the second set of signal contact elements are configured to electrically couple the second set of the first plurality of conductive structures to a second set of the corresponding conductive structures of the second plurality of conductive structures.

Another embodiment provides a method for forming an interposer connector configured to electrically couple conductive structures formed on a first electronic component to conductive structures formed on a second electronic component. The method includes forming one or more holes extending from a first major surface of a first isolation layer to a second major surface of the first isolation layer, forming a first conductive layer in contact with the first major surface of the first isolation layer, forming a plurality of contact elements on the second major surface of the first isolation layer, and forming a conductor in a hole of the one or more holes extending through the first isolation layer. The plurality of contact elements includes a first set of ground contact elements and a first set of signal contact elements. A signal contact element of the first set of signal contact elements is formed near to but electrically isolated from a ground contact element of the first set of ground contact elements. The conductor in the hole electrically couples a ground contact element of the plurality of ground contact elements with the first conductive layer.

In a further aspect of the above embodiment, forming the conductor in the hole includes one of forming a conductive plating on side walls of the hole, and forming a conductive via within the hole. In a further aspect, the method further includes forming a plurality of interposer units. Each interposer unit includes the first isolation layer, the first conductive layer, the first set of ground contact elements, and the first set of signal contact elements. In yet a further aspect, said forming each interposer unit further includes: providing a second isolation layer adjacent to and having a first major surface in contact with a second major surface of the first conductive layer where the second major surface of the first conductive layer is opposite to the first major surface of the first conductive layer; forming a second conductive layer in contact with a second major surface of the second isolation layer where the second major surface of the second isolation layer is opposite to a first major surface of the second conductive layer; providing a third isolation layer including one or more holes extending from a first major surface of the third isolation layer to a second major surface of the third isolation layer where the third isolation layers provided adjacent to and having the first major surface in contact with a second major surface of the second conductive layer; forming a second plurality of contact elements on the second major surface of the third isolation layer; and forming a conductor in a hole of the one or more holes through the third isolation layer. The second plurality of contact elements includes a second set of ground contact elements and a second set of signal contact elements. The second set of ground contact elements are in electrical contact with the second conductive layer using a conductor provided in a hole of the one or more holes through the third isolation layer. A signal contact element of the second set of signal contact elements is placed near to but electrically isolated from a ground contact element of the second set of ground contact elements. The conductor in the hole electrically couples a ground contact element of the second set of ground contact elements with the second conductive layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, interposers can be constructed with differing numbers of interposer units, signal connectors, ground pins, ground planes, and the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An interposer connector for electrically coupling conductive structures formed on a first electronic component to conductive structures formed on a second electronic component, the interposer comprising:
   a first isolation layer comprising one or more holes extending from a first major surface of the first isolation layer to a second major surface of the first isolation layer;
   a first conductive layer provided adjacent to and having a first major surface in contact with the first major surface of the first isolation layer;
   a first set of ground contact elements provided on the second major surface of the first isolation layer, wherein the first set of ground contacts are in electrical contact with the first conductive layer using a conductor provided in a hole of the one or more holes through the first isolation layer; and
   a first set of signal contact elements provided on the second major surface of the first isolation layer, wherein a signal contact element of the first set of signal contact elements is placed near to but electrically isolated from a ground contact element of the first set of ground contact elements.

2. The interposer of claim 1 wherein the first conductive layer is configured as a ground plane.

3. The interposer of claim 2 wherein the signal contact element is electrically isolated from the ground plane.

4. The interposer of claim 1 wherein the conductor formed in the hole comprises:
   a conductive plating formed on side walls of the hole.

5. The interposer of claim 1 wherein the conductor formed in the hole comprises:
   a conductive via formed within the hole.

6. The interposer of claim 1 comprising:
   a plurality of interposer units, wherein
   each interposer unit comprises the first isolation layer, the first conductive layer, the first set of ground contact elements, and the first set of signal contact elements.

7. The interposer of claim 6 wherein each interposer unit further comprises:
   a second isolation layer provided adjacent to and having a first major surface in contact with a second major surface of the first conductive layer, wherein the second major surface of the first conductive layer is opposite to the first major surface of the first conductive layer;
   a second conductive layer provided adjacent to and having a first major surface in contact with a second major surface of the second isolation layer, wherein the second major surface of the second isolation layer is opposite to the first major surface of the second conductive layer;
   a third isolation layer comprising one or more holes extending from a first major surface of the third isolation layer to a second major surface of the third isolation layer, wherein the third isolation layer is provided adjacent to and having the first major surface in contact with a second major surface of the second conductive layer;
   a second set of ground contact elements provided on a second major surface of the third isolation layer, wherein
      the second set of ground contacts are in electrical contact with the second conductive layer using a conductor provided in a hole of the one or more holes through the third isolation layer, and
      the second major surface of the third isolation layer is opposite to the first major surface of the third isolation layer; and
   a second set of signal contact elements provided on the second major surface of the third isolation layer, wherein a signal contact element of the second set of signal contact elements is placed near to but electrically isolated from a ground contact element of the second set of ground contact elements.

8. The interposer of claim 7 further comprising:
   an interior isolation layer comprising first and second opposing major surfaces, wherein
      a first interposer unit of the plurality of interposer units is positioned adjacent to and having the first set of contact elements and first set of ground elements in contact with the first major surface of the interior isolation layer, and
      a second interposer unit of the plurality of interposer units is positioned adjacent to and having the second set of contact elements and second set of ground elements in contact with the second major surface of the interior isolation layer.

9. The interposer of claim 6, wherein the interposer unit further comprises:
   a second isolation layer provided adjacent to and having a first major surface in contact with second major surface of the first conductive layer, wherein the second major surface of the first conductive layer is opposite to the first major surface of the first conductive layer; and
   a third isolation layer provided adjacent to and having a first major surface in contact with a second major surface of the second isolation layer, wherein
      the second major surface of the second isolation layer is opposite to the first major surface of the second isolation layer, the third isolation layer further comprises a conductive signal trace formed on the first major surface of the third isolation layer, and the conductive signal trace is electrically coupled to two or more signal contact elements of the first set of signal contact elements and configured to provide a signal from one of the two or more signal contact elements to the other coupled signal contact elements.

10. The interposer of claim 9 further comprising:
a conductive via, corresponding to each of the two or more signal contact elements, formed through the first isolation layer, first conductive layer, and second isolation layer and configured to electrically couple each of the two or more signal contact elements with the conductive trace, wherein
the conductive via formed through the first conductive layer is insulated from the first conductive layer.

11. The interposer of claim 1, wherein
a signal contact element of the first set of signal contact elements is configured to physically contact a conductive structure of the first electronic component, physically contact a conductive structure of the second electronic component, and
electrically couple the conductive structure of the first electronic component to the conductive structure of the second electronic component.

12. The interposer of claim 1 wherein the first isolation layer comprises a printed circuit board substrate.

13. The interposer of claim 1, wherein
a first set of one or more signal pads of a first semiconductor device are placed in contact with corresponding signal contact elements of the first set of signal contact elements,
a first set of one or more signal pads of a second semiconductor device are placed in contact with corresponding signal contact elements of the first set of signal contact elements, and
the interposer is configured to provide a signal path from a signal pad of the first semiconductor device to a signal pad of the second semiconductor device.

14. An electronic device comprising:
a first electronic component comprising a first plurality of conductive structures on a first major surface of the first electronic component;
a second electronic component comprising a second plurality of conductive structures on a first major surface of the second electronic component;
an interposer, electrically coupling one or more of the first plurality of conductive structures to corresponding conductive structures of the second plurality of conductive structures, wherein the interposer comprises
a first isolation layer comprising one or more holes extending from a first major surface of the first isolation layer to a second major surface of the first isolation layer,
a first conductive layer provided adjacent to and having a first major surface in contact with the first major surface of the first isolation layer,
a first set of ground contact elements provided on the second major surface of the first isolation layer, wherein the first set of ground contact elements are in electrical contact with the first conductive layer using a conductor provided in a hole of the one or more holes through the first isolation layer,
a first set of signal contact elements provided on the second major surface of the first isolation layer, wherein a signal contact element of the first set of signal contact elements is placed near to but electrically isolated from a ground contact element of the first set of ground contact elements, and the first set of ground contact elements and the first set of signal contact elements are configured to electrically couple a set of the first plurality of conductive structures to a set of the corresponding conductive structures of the second plurality of conductive structures.

15. The electronic device of claim 14 wherein the interposer further comprises:
a plurality of interposer units, wherein
each interposer unit comprises the first isolation layer, the conductive layer, the first set of ground contact elements, and the first set of signal contact elements.

16. The electronic device of claim 15 wherein each interposer unit further comprises:
a second isolation layer provided adjacent to and having a first major surface in contact with second major surface of the first conductive layer, wherein the second major surface of the first conductive layer is opposite to the first major surface of the first conductive layer;
a second conductive layer provided adjacent to and having a first major surface in contact with a second major surface of the second isolation layer, wherein the second major surface of the second isolation layer is opposite to the first major surface of the second conductive layer;
a third isolation layer comprising one or more holes extending from a first major surface of the third isolation layer to a second major surface of the third isolation layer, wherein the third isolation layer is provided adjacent to and having the first major surface in contact with a second major surface of the second conductive layer;
a second set of ground contact elements provided on a second major surface of the third isolation layer, wherein
the second set of ground contact elements are in electrical contact with the second conductive layer using a conductor provided in a hole of the one or more holes through the third isolation layer, and
the second major surface of the third isolation layer is opposite to the first major surface of the third isolation layer; and
a second set of signal contact elements provided on the second major surface of the third isolation layer, wherein
a signal contact element of the second set of signal contact elements is placed near to but electrically isolated from a ground contact element of the second set of ground contact elements, and
the second set of ground contact elements and the second set of signal contact elements are configured to electrically couple a second set of the first plurality of conductive structures to a second set of the corresponding conductive structures of the second plurality of conductive structures.

17. A method for forming an interposer connector configured to electrically couple conductive structures formed on a first electronic component to conductive structures formed on a second electronic component, the method comprising:
forming one or more holes extending from a first major surface of a first isolation layer to a second major surface of the first isolation layer;

forming a first conductive layer in contact with the first major surface of the first isolation layer;

forming a plurality of contact elements on the second major surface of the first isolation layer, wherein the plurality of contact elements comprises a first set of ground contact elements and a first set of signal contact elements, a signal contact element of the first set of signal contact elements is formed near to but electrically isolated from a ground contact element of the first set of ground contact elements;

forming a conductor in a hole of the one or more holes extending through the first isolation layer, wherein the conductor electrically couples a ground contact element of the plurality of ground contact elements with the first conductive layer.

18. The method of claim 17, wherein forming the conductor in the hole comprises one of forming a conductive plating on side walls of the hole; and forming a conductive via within the hole.

19. The method of claim 17 further comprising:

forming a plurality of interposer units, wherein each interposer unit comprises the first isolation layer, the first conductive layer, the first set of ground contact elements, and the first set of signal contact elements.

20. The method of claim 19 wherein said forming each interposer unit further comprises:

providing a second isolation layer adjacent to and having a first major surface in contact with a second major surface of the first conductive layer, wherein the second major surface of the first conductive layer is opposite to the first major surface of the first conductive layer;

forming a second conductive layer in contact with a second major surface of the second isolation layer, wherein the second major surface of the second isolation layer is opposite to a first major surface of the second conductive layer;

providing a third isolation layer comprising one or more holes extending from a first major surface of the third isolation layer to a second major surface of the third isolation layer, wherein the third isolation layer is provided adjacent to and having the first major surface in contact with a second major surface of the second conductive layer;

forming a second plurality of contact elements on the second major surface of the third isolation layer, wherein the second plurality of contact elements comprises a second set of ground contact elements and a second set of signal contact elements, the second set of ground contact elements are in electrical contact with the second conductive layer using a conductor provided in a hole of the one or more holes through the third isolation layer, and a signal contact element of the second set of signal contact elements is placed near to but electrically isolated from a ground contact element of the second set of ground contact elements; and forming a conductor in a hole of the one or more holes through the third isolation layer, wherein the conductor electrically couples a ground contact element of the second set of ground contact elements with the second conductive layer.

* * * * *